United States Patent
Lee et al.

(10) Patent No.: US 9,929,380 B2
(45) Date of Patent: Mar. 27, 2018

(54) METHOD OF MANUFACTURING LIGHT-EMITTING DISPLAY DEVICE

(71) Applicant: SAMSUNG DISPLAY CO., LTD., Yongin-si, Gyeonggi-do (KR)

(72) Inventors: Duck Jung Lee, Hwaseong-si (KR); Young Gil Kwon, Suwon-si (KR); Mu Gyeom Kim, Hwaseong-si (KR); Ji Young Choung, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/138,341

(22) Filed: Apr. 26, 2016

(65) Prior Publication Data

US 2017/0125745 A1    May 4, 2017

(30) Foreign Application Priority Data

Nov. 2, 2015   (KR) .................. 10-2015-0153082

(51) Int. Cl.

| | |
|---|---|
| *H01L 51/00* | (2006.01) |
| *H01L 51/56* | (2006.01) |
| *H01L 27/32* | (2006.01) |
| *H01L 51/50* | (2006.01) |

(52) U.S. Cl.
CPC .......... *H01L 51/56* (2013.01); *H01L 27/3211* (2013.01); *H01L 27/3246* (2013.01); *H01L 51/0004* (2013.01); *H01L 51/0016* (2013.01); *H01L 51/5012* (2013.01); *H01L 51/5056* (2013.01); *H01L 51/5088* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 8,106,402 B2 * | 1/2012 | Yeo | H01L 27/3248 257/59 |
| 8,415,675 B2 * | 4/2013 | Im | H01L 27/3246 257/40 |
| 8,871,558 B2 * | 10/2014 | Kim | H01L 51/0011 257/40 |
| 8,922,871 B2 | 12/2014 | Choi et al. | |
| 9,245,905 B2 * | 1/2016 | Park, II | H01L 27/1225 |

(Continued)

*Primary Examiner* — Evren Seven
(74) *Attorney, Agent, or Firm* — Lee & Morse P.C.

(57) ABSTRACT

Provided is a method of manufacturing a light-emitting display device. The method of manufacturing a light-emitting display device may comprise: forming a first electrode on a substrate, the substrate having a plurality of first pixel areas and a plurality of second pixel areas, the first electrode being formed in each of the first and second pixel areas such that corresponding first and second pixels are formed; forming a pixel defining layer on the substrate, the pixel defining layer having an opening exposing the first electrode of each of the first and second pixels; forming a first photoresist pattern on the pixel defining layer, the first photoresist pattern having a first pattern opening exposing the first electrode of each of the first pixels; forming a light-emitting layer on the first electrode exposed through the first pattern opening; and removing the first photoresist pattern.

13 Claims, 14 Drawing Sheets

(56) References Cited

U.S. PATENT DOCUMENTS

| | | | | |
|---|---|---|---|---|
| 2005/0093441 | A1* | 5/2005 | Uhlig | H01L 27/3283 |
| | | | | 313/506 |
| 2007/0238218 | A1* | 10/2007 | Teng | H01L 27/322 |
| | | | | 438/99 |
| 2010/0181559 | A1* | 7/2010 | Nakatani | H01L 27/3246 |
| | | | | 257/40 |
| 2011/0042691 | A1* | 2/2011 | Hayata | H01L 51/0005 |
| | | | | 257/88 |
| 2011/0127500 | A1* | 6/2011 | Ko | H01L 27/3211 |
| | | | | 257/40 |
| 2011/0248247 | A1* | 10/2011 | Matsumoto | C09K 11/06 |
| | | | | 257/40 |
| 2011/0309339 | A1* | 12/2011 | You | H01L 27/3248 |
| | | | | 257/40 |
| 2012/0097933 | A1* | 4/2012 | Ando | H01L 51/001 |
| | | | | 257/40 |
| 2013/0341607 | A1* | 12/2013 | Heo | H01L 51/56 |
| | | | | 257/40 |
| 2014/0061603 | A1* | 3/2014 | Kim | H01L 51/5253 |
| | | | | 257/40 |
| 2014/0120645 | A1* | 5/2014 | Paek | H01L 27/3211 |
| | | | | 438/35 |
| 2014/0161968 | A1 | 6/2014 | Kang | |
| 2014/0353597 | A1* | 12/2014 | Ahn | H01L 51/5265 |
| | | | | 257/40 |
| 2015/0137086 | A1* | 5/2015 | Yasumatsu | H05B 33/10 |
| | | | | 257/40 |
| 2015/0303393 | A1* | 10/2015 | Dai | H01L 51/0004 |
| | | | | 257/40 |
| 2016/0293675 | A1* | 10/2016 | Kim, II | H01L 27/3211 |

* cited by examiner

METHOD OF MANUFACTURING LIGHT-EMITTING DISPLAY DEVICE

CROSS-REFERENCE TO RELATED APPLICATION

Korean Patent Application No. 10-2015-0153082, filed on Nov. 2, 2015, in the Korean Intellectual Property Office, and entitled: "Method of Manufacturing Light-Emitting Display Device," is incorporated by reference herein in its entirety.

BACKGROUND

1. Field

Exemplary embodiments relate to a method of manufacturing a light-emitting display device.

2. Description of the Related Art

Of light-emitting display devices, organic light-emitting display devices, which are self-luminous display devices, have a wide viewing angle, high contrast, and fast response speed.

An organic light-emitting display device may include a light-emitting layer made of an organic light-emitting material between an anode and a cathode. When positive and negative voltages are respectively applied to these electrodes, holes move from the anode to the light-emitting layer via a hole injection layer and a hole transport layer, and electrons move from the cathode to the light-emitting layer via an electron injection layer and an electron transport layer. The electrons and the holes recombine in the light-emitting layer to generate excitons. As the excitons change from an excited state to a ground state, the light-emitting layer emits light. As a result, an image is displayed on the organic light-emitting display device.

SUMMARY

Exemplary embodiments may provide a method of manufacturing a light-emitting display device that may comprise: forming a first electrode on a substrate, the substrate having a plurality of first pixel areas and a plurality of second pixel areas, the first electrode being formed in each of the first and second pixel areas such that corresponding first and second pixels are formed; forming a pixel defining layer on the substrate, the pixel defining layer having an opening exposing the first electrode of each of the first and second pixels; forming a first photoresist pattern on the pixel defining layer, the first photoresist pattern having a first pattern opening exposing the first electrode of each of the first pixels; forming a light-emitting layer on the first electrode exposed through the first pattern opening; and removing the first photoresist pattern.

The removing of the first photoresist pattern may be performed using a lift-off process.

The first photoresist pattern may comprise fluorine resin.

The light-emitting layer may be formed using a printing method.

The first and second pixels may emit light of different colors, and the first photoresist pattern may cover the second pixels during the forming of the light emitting layer on the first electrode exposed through the first pattern opening.

The method of manufacturing a light-emitting display device may further comprise, between the forming of the first photoresist pattern and the forming of the light-emitting layer, forming at least one of a hole injection layer and a hole transport layer on the first electrode exposed through the first pattern opening.

Each of the hole injection layer and the hole transport layer may be formed using a printing method.

The method of manufacturing a light-emitting display device further comprising, after the removing of the first photoresist pattern, forming a second photoresist pattern on the pixel defining layer, the second photoresist pattern having a second pattern opening exposing the first electrode of each of the second pixels; forming a second light-emitting layer on the first electrode exposed through the second pattern opening, the second light-emitting layer emitting light of a different color from the light-emitting layer of each of the first pixels; and removing the second photoresist pattern.

The forming of the light-emitting layer may include ejecting a light-emitting solution onto the first electrode of each of the first pixels and then drying the ejected light-emitting solution, and the first photoresist pattern may cover the second pixels during the forming of the light emitting layer on the first electrode exposed through the first pattern opening.

The forming of the light-emitting layer may include ejecting a light-emitting solution onto the first electrodes of some of the first pixels and tilting the substrate to cause the light-emitting solution to flow onto the first electrode of other ones of the first pixels, and the first photoresist pattern may cover the second pixels during the forming of the light emitting layer on the first electrode exposed through the first pattern opening.

The first pixels may form a plurality of pixel columns along a second direction intersecting a first direction, and the second pixels may form a plurality of pixel columns along the second direction, and wherein the pixel columns of the first pixels and the pixel columns of the second pixels may be located alternately along the first direction and the some of the first pixels may form one of the pixel columns of the first pixels.

The first pixels may form a plurality of pixel columns along a second direction intersecting a first direction, and the second pixels may form a plurality of pixel columns along the second direction, and wherein the pixel columns of the first pixels and the pixel columns of the second pixels may be located alternately along the first direction, and the some of the first pixels may form a plurality of pixel columns and at least one pixel column formed by the other ones of the first pixels onto which the light-emitting solution is not ejected is interposed therebetween.

When the light-emitting solution is ejected, first and second sides of the substrate may be at a same height, and wherein the tilting of the substrate is achieved by placing the first and second sides of the substrate at different heights.

The forming of the light-emitting layer may further include applying air of an air knife to the light-emitting solution.

After the light-emitting solution is coated on the first electrodes of the other ones of the first pixels, the forming of the light-emitting layer may further include tilting the substrate such that the first and second sides of the substrate are at a same height and drying the light-emitting.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
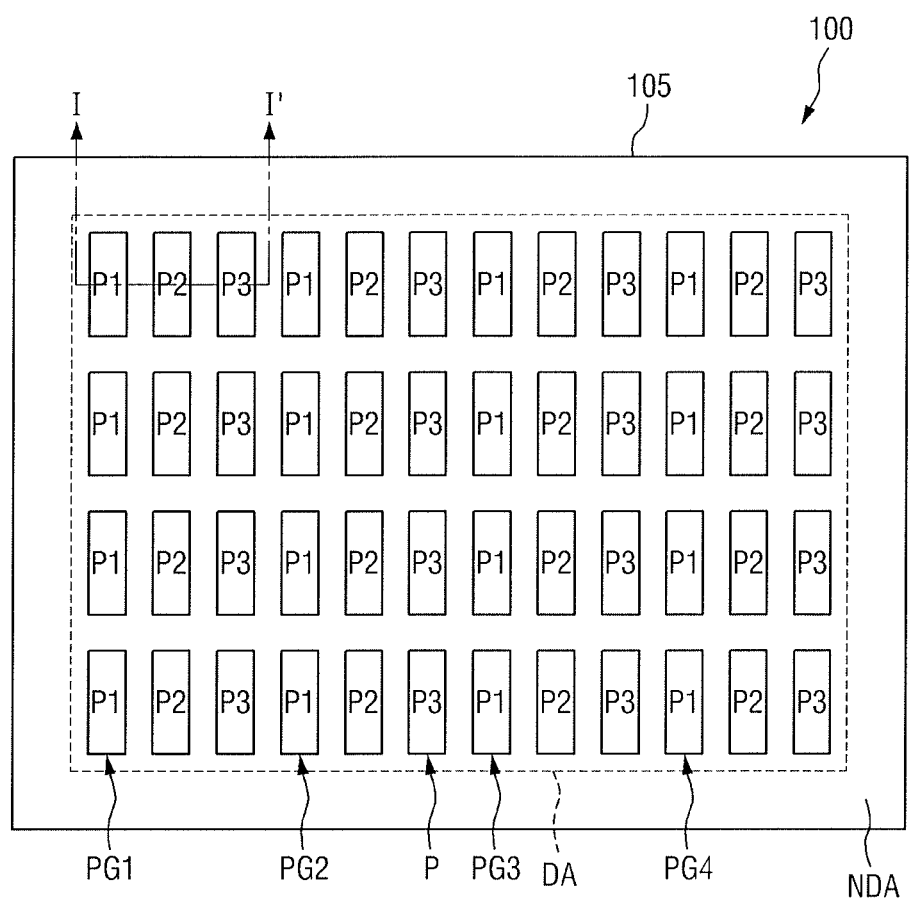
FIG. 1 illustrates a schematic plan view of pixels that may be included in a light-emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of the exemplary embodiments.

Hereinafter, exemplary embodiments will be described with reference to the attached drawings.

Figure 2:
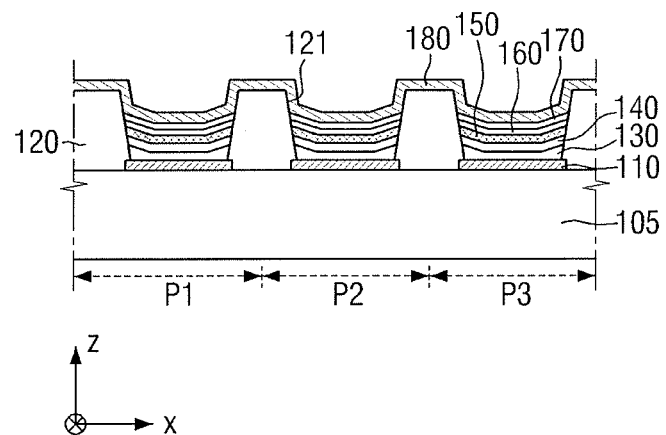
FIG. 2 illustrates a cross-sectional view taken along the line I-I' of FIG. 1.

FIG. 1 is a schematic plan view of pixels P that may be included in a light-emitting display device 100 according to an exemplary embodiment. FIG. 2 is a cross-sectional view taken along the line I-I' of FIG. 1.

Referring to FIGS. 1 and 2, the light-emitting display device 100 according to the exemplary embodiment may include a substrate 105, a first electrode 110, a pixel defining layer 120, a hole injection layer 130, a hole transport layer 140, a light-emitting layer 150, an electron transport layer 160, an electron injection layer 170, and a second electrode 180. These elements may be stacked sequentially in, for example, a Z direction of FIG. 2.

The substrate 105 may include a display area DA which includes a plurality of pixels P displaying an image and a non-display area NDA which is located outside the display area DA. The pixels P may be arranged in a matrix along a first direction X and a second direction Y intersecting the first direction X. The pixels P may include first pixels P1, second pixels P2, and third pixels P3. The first pixels P1 may be red pixels, for example, which emit red light, the second pixels P2 may be green pixels, for example, which emit green light, and the third pixels P3 may be blue pixels, for example, which emit blue light.

In FIG. 1, the pixels P include the first through third pixels P1 through P3 which may emit light of three different colors, for example. However, the exemplary embodiment is not limited thereto. The pixels P may also include first and second pixels which emit light of two different colors, for example. In addition, in FIG. 1, pixels P which emit light of a same color may be arranged, for example, in a line along the second direction Y, and pixels P which emit light of different colors may be alternately arranged along the first direction X. However, the exemplary embodiments are not limited to this arrangement.

The first pixels P1 may form a plurality of pixel columns along the second direction Y, the second pixels P2 may form a plurality of pixel columns along the second direction Y, and the third pixels P3 may form a plurality of pixel columns along the second direction Y. The pixel columns of the first pixels P1, the pixel columns of the second pixels P2, and the pixel columns of the third pixels P3 may be alternately arranged along the first direction X. In FIG. 1, the pixel columns of the first pixels P1 include first through fourth pixel columns PG1 through PG4 located along the first direction X. The pixel columns of the second pixels P2 and the pixel columns of the third pixels P3 may be configured in the same way as the pixel columns of the first pixels P1.

The substrate 105 may include an insulating substrate, for example. The insulating substrate may be made of a transparent glass material containing $SiO_2$, for example, as its main component. In some embodiments, the insulating substrate may be made of, for example, an opaque material or a plastic material. Further, the insulating substrate may be a flexible substrate.

The substrate 105 may further include other structures formed on the insulating substrate. Examples of the structures may include wirings, electrodes, and insulating layers. In some embodiments, the substrate 105 may include a plurality of thin-film transistors (TFTs) formed on the insulating substrate. Each of at least some of the TFTs may have a drain electrode electrically connected to the first electrode 110. Each of the TFTs may include an active region made of, for example, amorphous silicon, polycrystalline silicon or monocrystalline silicon. In some embodiments, each of the TFTs may include an active region made of an oxide semiconductor, for example.

The first electrode 110 may be formed on the substrate 105 in each pixel P. The first electrode 110 may be an anode which provides holes to the light-emitting layer 150 in response to a signal transmitted to a corresponding TFT or a cathode which provides electrons to the light-emitting layer 150 in response to the signal transmitted to the TFT.

The first electrode 110 may be used as a transparent electrode, a reflective electrode, or a transflective electrode, for example. To be used as a transparent electrode, the first electrode 110 may be formed of indium tin oxide (ITO), indium zinc oxide (IZO), zinc oxide (ZnO), or $In_2O_3$, for example. To be used as a reflective electrode, the first electrode 110 may be produced by forming a reflective layer using, for example, Ag, Mg, Al, Pt, Pd, Au, Ni, Nd, Ir, Cr, or a compound of the same, and then forming ITO, IZO, ZnO or $In_2O_3$, for example, on the reflective layer. To be used as a transflective electrode, the first electrode 110 may be produced by forming a thin reflective layer using, for example, Ag, Mg, Al, Pt, Pd, Au, Ni, Nd, Ir, Cr, or a compound of the same, and then forming ITO, IZO, ZnO or $In_2O_3$, for example, on the thin reflective layer. The first electrode 110 may be formed by a photolithography method, for example, but is not limited thereto.

When the first electrode 110 is used as a transparent electrode, the light-emitting display device 100 may be a bottom emission light-emitting display device in which light generated by the light-emitting layer 150 is emitted toward the first electrode 110. In addition, when the first electrode 110 is used as a reflective electrode, the light-emitting display device 100 may be a top emission light-emitting display device in which light generated by the light-emitting layer 150 is emitted toward the second electrode 180. In addition, when the first electrode 110 is used as a transflective electrode, the light-emitting display device 100 may be a bottom emission light-emitting display device having a resonance structure in which light generated by the light-emitting layer 150 is emitted toward the first electrode 110.

The pixel defining layer 120 may be disposed on the substrate 105 and have a plurality of openings 121, each exposing the first electrode 110 and defining each pixel P on the substrate 105. The pixel defining layer 120 may allow the hole injection layer 130 to be formed on the first electrode 110 through each of the openings 121. The pixel defining layer 120 may be made of an insulating material, for example. In an example, the pixel defining layer 120 may be made of at least one organic material selected from benzocyclobutene (BCB), polyimide (PI), polyamide (PA), acrylic resin, and phenolic resin, for example. In another example, the pixel defining layer 120 may be made of an inorganic material such as silicon nitride, for example.

The hole injection layer 130 may be formed along the first electrode 110 and side surfaces of the pixel defining layer 120 within each of the openings 121 of the pixel defining layer 120. The hole injection layer 130 may be formed by ejecting a hole injection solution, which contains a hole injection material, into each of the openings 121 of the pixel defining layer 120 using a simple printing method such as an inkjet printing method or a nozzle printing method, for example, and drying the ejected hole injection solution. The hole injection layer 130 may become thicker toward edges thereof due to a coffee ring effect during the drying of the hole injection solution.

The hole injection layer 130 may be a buffer layer that lowers an energy barrier between the first electrode 110 and the hole transport layer 140. The hole injection layer 130 may facilitate the injection of holes from the first electrode 110 into the hole transport layer 140. The hole injection layer 130 may be made of an organic compound such as, for example, 4,4',4"-tris(3-methylphenylphenylamino)triphenylamine (MTDATA), copper phthalocyanine (CuPc), or poly(3,4-ethylenedioxythiophene)/polystyrene sulfonate (PEDOT/PSS).

The hole transport layer 140 may be disposed on the hole injection layer 130 within each of the openings 121 of the pixel defining layer 120. The hole transport layer 140 may be formed by ejecting a hole transport solution, which contains a hole transport material, into each of the openings 121 of the pixel defining layer 120 using a simple printing method such as an inkjet printing method or a nozzle printing method, for example, and drying the ejected hole transport solution.

The hole transport layer 140 may transport holes received through the hole injection layer 130 to the light-emitting layer 150. The hole transport layer 140 may be made of a hole transport material having lower electrical conductivity than the hole injection layer 130. The hole transport layer 140 may be made of an organic compound such as, for example, N,N'-diphenyl-N,N'-bis(3-methylphenyl)-1,1'-biphenyl-4,4'-diamine (TPD) or N,N-di(naphthalen-1-yl)-N,N'-diphenyl-benzidine (NPB), but is not limited thereto.

The light-emitting layer 150 may be disposed on the hole transport layer 140 within each of the openings 121 of the pixel defining layer 120. The light-emitting layer 150 may be formed by ejecting a light-emitting solution, which contains a light-emitting material, into each of the openings 121 of the pixel defining layer 120 using a simple printing method such as an inkjet printing method or a nozzle printing method, for example.

The light-emitting layer 150 may emit light by recombining holes received from the first electrode 110 and electrons received from the second electrode 180. For example, holes and electrons provided to the light-emitting layer 150 may combine to form excitons. When the excitons change from an excited state to a ground state, the light-emitting layer 150 may emit light. The light-emitting layer 150 may be, for example, a red light-emitting layer which emits red light, a green light-emitting layer which emits green light, or a blue light-emitting layer which emits blue light.

The red light-emitting layer may include, for example, one red light-emitting material or a host and a red dopant. Examples of the host of the red light-emitting layer may include, for example, tris(8-quinolinolate)aluminum ($Alq_3$), 4,4'-N,N'-dicarbazol-biphenyl (CBP), ploy(n-vinylcarbazole) (PVK), 9,10-Di(naphthyl-2-yl)anthrace (ADN), 4,4', 4"-tris(N-carbazolyl)triphenylamine (TCTA), 1,3,5-tris(N-phenylbenzimidazol-2-yl)benzene (TPBI), 3-tert-butyl-9, 10-di(naphth-2-yl) anthracene (TBADN), ter-fluorene (E3), and distyrylarylene (DSA), but are not limited thereto. In addition, examples of the red dopant may include, for example, PtOEP, $Ir(piq)_3$, and $Btp_2Ir(acac)$, but are not limited thereto.

The green light-emitting layer may include, for example, one green light-emitting material or a host and a green dopant. The host of the red light-emitting layer may be used as the host of the green light-emitting layer. Examples of the green dopant may include, for example, $Ir(ppy)_3$, $Ir(ppy)_2$ (acac), and $Ir(mpyp)_3$, but are not limited thereto.

The blue light-emitting layer may include, for example, one blue light-emitting material or a host and a blue dopant. The host of the red light-emitting layer may be used as the host of the blue light-emitting layer. Examples of the blue dopant may include, for example, $F_2Irpic$, $(F_2ppy)_2Ir(tmd)$, $Ir(dfppz)_3$, ter-fluorene, 4,4'-bis(4-diphenylaminostyryl) biphenyl (DPAVBi), and 2,5,8,11-tetra-tert-butyl pherylene (TBPe), but are not limited thereto.

The electron transport layer 160 may be disposed on the light-emitting layer 150. The electron transport layer 160 may transport electrons received from the second electrode 180 via the electron injection layer 170 to the light-emitting layer 150. The electron transport layer 160 may be made of an organic compound such as, for example, 4,7-diphenyl-1, 10-phenanthroline (Bphen), aluminum(III)bis(2-methyl-8-hydroxyquinolinato)4-phenylphenolate (BAlq), tris(8-quinolinorate)aluminum ($Alq_3$), berylliumbis(benzoquinolin-10-olate) ($Bebq_2$), or 1,3,5-tris(N-phenylbenzimidazole-2-yl)benzene (TPBI), but are not limited thereto. The electron transport layer 160 may be formed by a deposition method, for example, but is not limited thereto.

The electron injection layer 170 may be disposed on the electron transport layer 160. The electron injection layer 170 may be a buffer layer that lowers an energy barrier between the electron transport layer 160 and the second electrode 180. The electron injection layer 170 may facilitate the injection of electrons from the second electrode 180 into the electron transport layer 160. The electron injection layer 170 may be made of, for example, LiF or CsF, but is not limited thereto. The electron injection layer 170 may be formed by a deposition method, for example, but is not limited thereto.

The second electrode 180 may be disposed on the electron injection layer 170 and may be, for example, a cathode providing electrons to the light-emitting layer 150 or an anode providing holes to the light-emitting layer 150. Like the first electrode 110, the second electrode 180 may also be used as a transparent electrode, a reflective electrode, or a transflective electrode. When the second electrode 180 is used as a transparent electrode, the light-emitting display device 100 may be a top emission light-emitting display device in which light generated by the light-emitting layer 150 is emitted toward the second electrode 180. In addition, when the second electrode 180 is used as a reflective electrode, the light-emitting display device 100 may be a bottom emission light-emitting display device in which light generated by the light-emitting layer 150 is emitted toward the first electrode 110. In addition, when the second electrode 180 is used as a transflective electrode, the light-emitting display device 100 may be a top emission light-emitting display device having a resonance structure in which light generated by the light-emitting layer 150 is emitted toward the second electrode 180. The second electrode 180 may be formed by a deposition method, for example, but is not limited thereto.

The light-emitting display device 100 may further include an encapsulation substrate placed on the second electrode 180. The encapsulation substrate may be made of an insulating substrate, for example. A spacer may be disposed between the second electrode 180 on the pixel defining layer 120 and the encapsulation substrate. In other exemplary embodiments, the encapsulation substrate may be omitted. In this case, an encapsulation layer made of an insulating material may cover and thus protect the entire structure.

The light-emitting display device 100 according to the exemplary embodiment may include the hole injection layer 130, the hole transport layer 140 and the light-emitting layer 150 formed using a simple printing method, for example. Therefore, the entire process of manufacturing the light-emitting display device 100 may be simplified.

Figure 3:
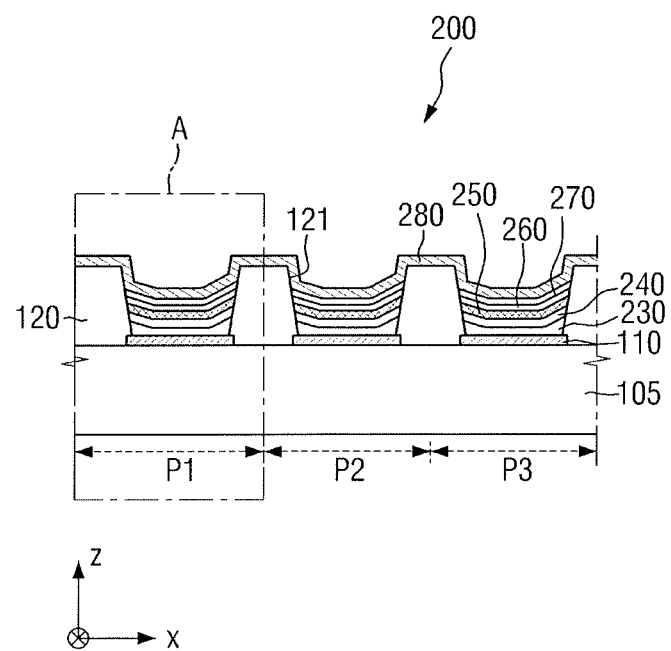
FIG. 3 illustrates a cross-sectional view of a light-emitting display device according to another exemplary embodiment.
Figure 4:
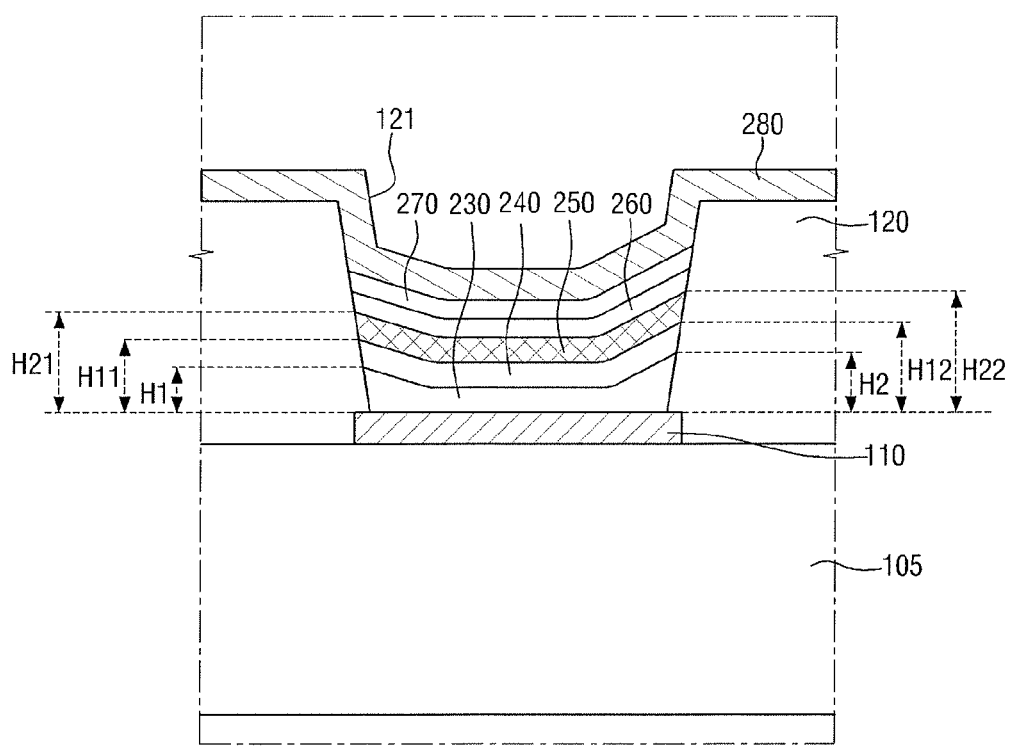
FIG. 4 illustrates an enlarged cross-sectional view of a portion 'A' of FIG. 3.

FIG. 3 is a cross-sectional view of a light-emitting display device 200 according to another exemplary embodiment. FIG. 4 is an enlarged cross-sectional view of a portion 'A' of FIG. 3.

Referring to FIGS. 3 and 4, the light-emitting display device 200 according to the exemplary embodiment may have the same configuration as the light-emitting display device 100 of FIG. 2 except for a hole injection layer 230, a hole transport layer 240, a light-emitting layer 250, an electron transport layer 260, an electron injection layer 270, and a second electrode 280. Accordingly, the light-emitting display device 200 according to the exemplary embodiment will hereinafter be described, focusing mainly on the hole injection layer 230, the hole transport layer 240, the light-emitting layer 250, the electron transport layer 260, the electron injection layer 270 and the second electrode 280.

The light-emitting display device 200 according to the exemplary embodiment may include a substrate 105, a first electrode 110, a pixel defining layer 120, the hole injection layer 230, the hole transport layer 240, the light-emitting layer 250, the electron transport layer 260, the electron injection layer 270 and the second electrode 280. These elements may be stacked sequentially in, for example, a Z direction of FIG. 3.

The hole injection layer 230 may be similar to the hole injection layer 130 of FIG. 2. However, the hole injection layer 230 may have an asymmetrical shape in each of a plurality of openings 121 of the pixel defining layer 120. For example, a first height H1 from a surface of the first electrode 110 within each of the openings 121 of the pixel defining layer 120 to a surface of an edge of the hole injection layer 230 which contacts a side of the pixel defining layer 120 may be different from a second height H2 from the surface of the first electrode 110 within each of the openings 121 of the pixel defining layer 120 to a surface of another edge of the hole injection layer 230 which contacts the other side of the pixel defining layer 120. This difference may result from a process in which a hole injection solution 230a (see FIG. 16) ejected into some of the openings 121 of the pixel defining layer 120 to form the hole injection layer 230 is made to fill the other ones of the openings 121 of the pixel defining layer 120 by tilting the substrate 105 as illustrated in FIG. 17. If the hole injection solution 230a (see FIG. 16) ejected into some of the openings 121 of the pixel defining layer 120 is made to fill the other ones of the openings 121 of the pixel defining layer 120 by tilting the substrate 105, the entire manufacturing time may be reduced. In FIG. 3, the second height H2 may be greater than the first height H1, for example. However, the first height H1 may also be made greater than the second height H2 by changing the tilting direction of the substrate 105.

The hole transport layer 240 is similar to the hole transport layer 140 of FIG. 2. However, the hole transport layer 240 may have an asymmetrical shape in each of the openings 121 of the pixel defining layer 120. For example, a first height H11 from the surface of the first electrode 110 within each of the openings 121 of the pixel defining layer 120 to a surface of an edge of the hole transport layer 240 which contacts a side of the pixel defining layer 120 may be different from a second height H12 from the surface of the first electrode 110 within each of the openings 121 of the pixel defining layer 120 to a surface of another edge of the hole transport layer 240 which contacts the other side of the pixel defining layer 120. This difference results from a process in which a hole transport solution 240a (see FIG. 19) ejected into some of the openings 121 of the pixel defining layer 120 to form the hole transport layer 240 is made to fill the other ones of the openings 121 of the pixel defining layer 120 by tilting the substrate 105 as illustrated in FIG. 20. If the hole transport solution 240a (see FIG. 19) ejected into some of the openings 121 of the pixel defining layer 120 is made to fill the other ones of the openings 121 of the pixel defining layer 120 by tilting the substrate 105, the entire manufacturing time may be reduced. In FIG. 3, the second height H12 is greater than the first height H11. However, the first height H11 may also be made greater than the second height H12 by changing the tilting direction of the substrate 105.

The light-emitting layer 250 is similar to the light-emitting layer 150 of FIG. 2. However, the light-emitting layer 250 may have an asymmetrical shape in each of the openings 121 of the pixel defining layer 120. For example, a first height H21 from the surface of the first electrode 110 within each of the openings 121 of the pixel defining layer 120 to a surface of an edge of the light-emitting layer 250 which contacts a side of the pixel defining layer 120 may be different from a second height H22 from the surface of the first electrode 110 within each of the openings 121 of the pixel defining layer 120 to a surface of another edge of the light-emitting layer 250 which contacts the other side of the pixel defining layer 120. This difference results from a process in which a light-emitting solution 250a (see FIG. 22) ejected into some of the openings 121 of the pixel defining layer 120 to form the light-emitting layer 250 is made to fill the other ones of the openings 121 of the pixel defining layer 120 by tilting the substrate 105 as illustrated in FIG. 23. If the light-emitting solution 250a (see FIG. 22) ejected into some of the openings 121 of the pixel defining layer 120 is made to fill the other ones of the openings 121 of the pixel defining layer 120 by tilting the substrate 105, the entire manufacturing time may be reduced. In FIG. 3, the second height H22 is greater than the first height H21. However, the first height H21 may also be made greater than the second height H22 by changing the tilting direction of the substrate 105.

The electron transport layer 260, the electron injection layer 270 and the second electrode 280 may be the same as the electron transport layer 160, the electron injection layer 170 and the second electrode 180 of FIG. 2 except that they may be disposed on the light-emitting layer 250 having an asymmetrical shape and, thus, a redundant description thereof is omitted.

The light-emitting display device 200 according to the exemplary embodiment may include the hole injection layer 230, the hole transport layer 240 and the light-emitting layer 250 formed using a simple printing method, for example. Therefore, the entire process of manufacturing the light-emitting display device 200 may be simplified, and the manufacturing time of the light-emitting display device 200 may be reduced.

A method of manufacturing the light-emitting display device 100 according to an exemplary embodiment will now be described.

FIGS. 5 through 15 are cross-sectional views illustrating a method of manufacturing the light-emitting display device 100 of FIG. 2.

Figure 5:
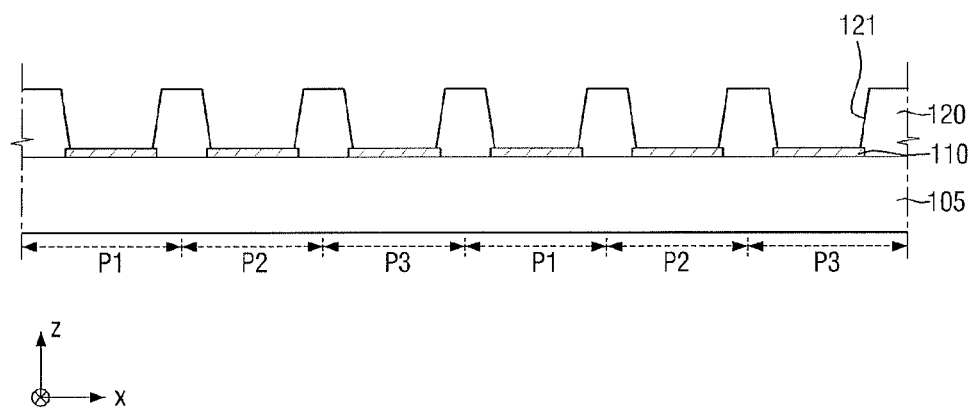
FIGS. 5 through 15 illustrate cross-sectional views illustrating a method of manufacturing the light-emitting display device of FIG. 2.

Referring to FIG. 5, a first electrode 110 may be formed on a substrate 105 having a plurality of pixels P (see FIG. 1). The first electrode 110 may be formed in each P1, P2 or P3 of the pixels P. A pixel defining layer 120, which defines each pixel P1, P2 or P3 and has a plurality of openings 121, may be formed on the substrate 105. The plurality of openings 121 each expose the first electrode 110.

The first electrode 110 may be formed by depositing and patterning at least one of a transparent electrode material, a reflective electrode material, and a transflective electrode material. The pixels P (see FIG. 1) may include first pixels P1, second pixels P2, and third pixels P3, for example. The first pixels P1 may be, but are not limited to, red pixels which emit red light, the second pixels P2 may be, but are not limited to, green pixels which emit green light, and the third pixels P3 may be, but are not limited to, blue pixels which emit blue light.

The pixel defining layer 120 may be formed, for example, by depositing an insulating material on the whole surface of the substrate 105 to cover the first electrode 110 and patterning the deposited insulating material.

Figure 6:
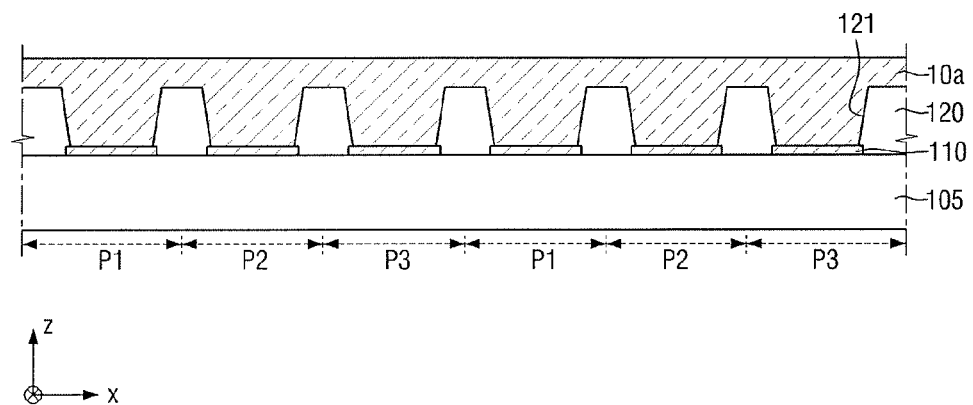
Figure 7:
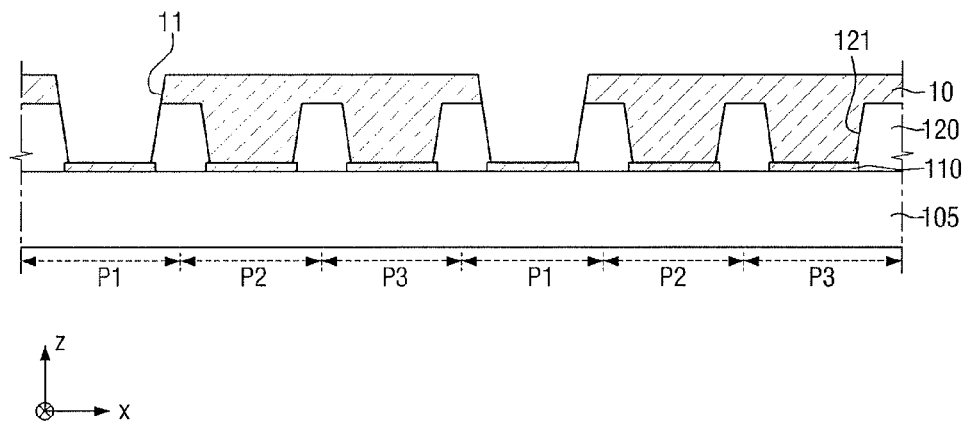

Referring to FIGS. 6 and 7, a first photoresist pattern 10 having first pattern openings 11, each exposing the first electrode 110 of each of the first pixels P1, may be formed on the pixel defining layer 120.

Specifically, referring to FIG. 6, a photoresist material 10a may be deposited on the whole surface of the pixel defining layer 120 using a deposition method to cover the first electrode 110.

Figure 12:
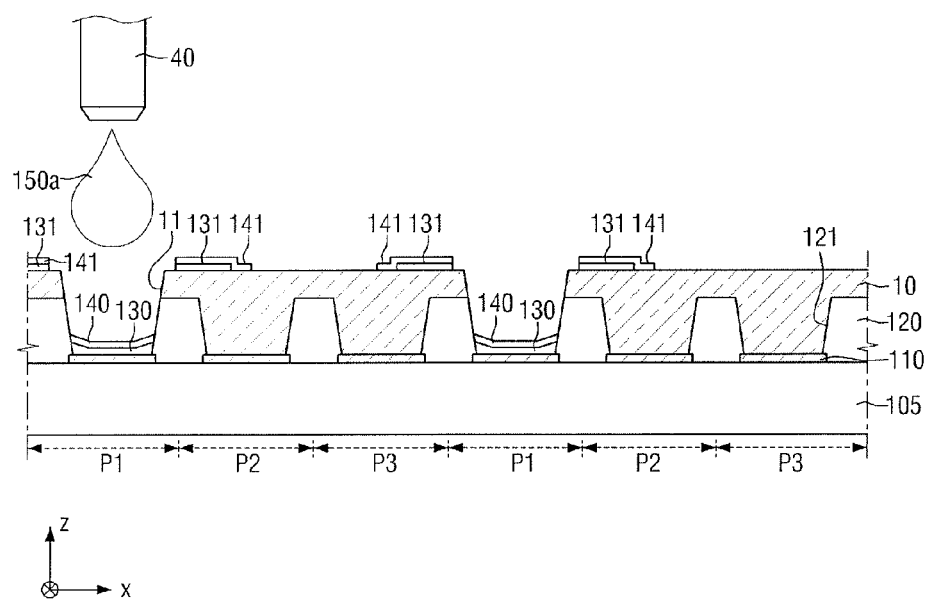

The photoresist material 10a may contain fluorine resin that does not react with a hole injection solution 130a (see FIG. 8), a hole transport solution 140a (see FIG. 10), and a light-emitting solution 150a (see FIG. 12).

The deposited photoresist material 10a may be patterned by a photolithography process, for example, thereby forming the first photoresist pattern 10 as illustrated in FIG. 7.

The first photoresist pattern 10 may be used to prevent the hole injection solution 130a (see FIG. 8), the hole transport solution 140a (see FIG. 10), and the light-emitting solution 150a (see FIG. 12) ejected onto the first electrode 110 of each of the first pixels P1 from unwantedly flowing onto the first electrode 110 of each of the second pixels P2 and the first electrode 110 of each of the third pixels P3. Here, the hole injection solution 130a (see FIG. 8), the hole transport solution 140a (see FIG. 10) and the light-emitting solution 150a (see FIG. 12) may be ejected using a printing method, for example, such as an inkjet printing method or a nozzle printing method. The amount of each of the hole injection solution 130a (see FIG. 8), the hole transport solution 140a (see FIG. 1) and the light-emitting solution 150a (see FIG. 12) ejected using a printing method may vary according to pixel size. However, the ejected amount may not be reduced to less than a minimum ejection amount to secure the stability of ejection.

The first photoresist pattern 10 may prevent the hole injection solution 130a, the hole transport solution 140a, and the light-emitting solution 150a ejected onto the first electrode 110 of each of the first pixels P1 from flowing onto the first electrode 110 of each of the second pixels P2 and the first electrode 110 of each of the third pixels P3 due to a small pixel size. This may prevent color mixing of pixels which emit light of different colors, thereby improving display quality and making it possible to realize a high-resolution light-emitting display device.

Figure 8:
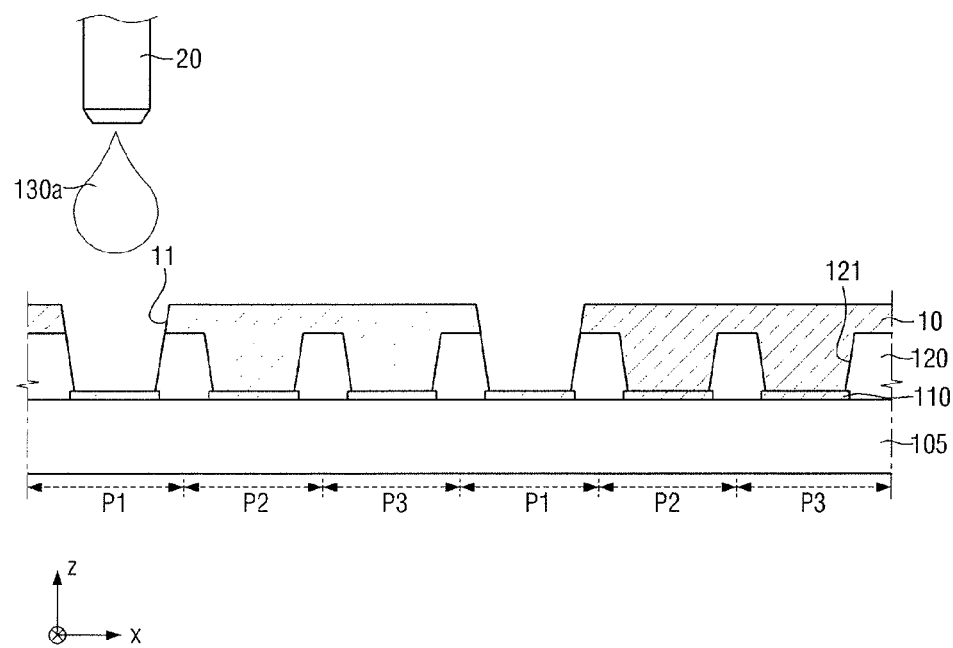
Figure 9:
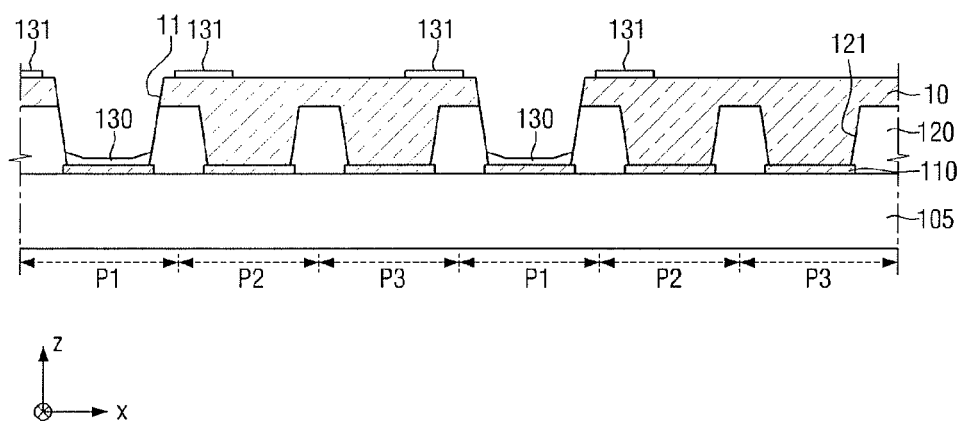

Referring to FIGS. 8 and 9, a hole injection layer 130 may be formed on the first electrode 110 of each of the first pixels P1 which is exposed through one of the first pattern openings 11 of the first photoresist pattern 10.

Specifically, referring to FIG. 8, the hole injection solution 130a may be ejected onto the first electrode 110 of each of the first pixels P1 which is exposed through one of the first pattern openings 11 of the first photoresist pattern 10 using, for example, an ejector 20. If a minimum amount of the hole injection solution 130a ejected once into an opening 121 of the pixel defining layer 120 through each of the first pattern openings 11 of the first photoresist pattern 10 is greater than an amount of the hole injection solution 130a which fills the opening 121 of the pixel defining layer 120, some of the hole injection solution 130a may flow onto the first photoresist pattern 10 in a part of an adjacent pixel (e.g., a part of a second pixel P2).

When the hole injection layer 130 is formed by drying the hole injection solution 130a ejected onto the first electrode 110 of each of the first pixels P1, as illustrated in FIG. 9, some of the hole injection solution 130a which is located on the first photoresist pattern 10 on the part of the adjacent pixel (e.g., the part of the second pixel P2) may be dried, thereby forming a residual layer 131.

Figure 10:
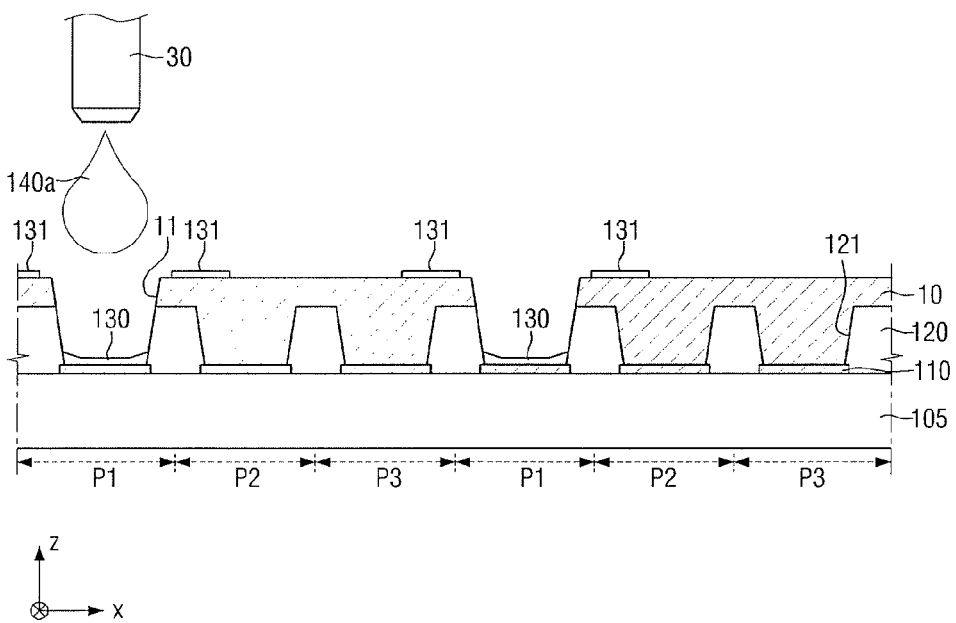
Figure 11:
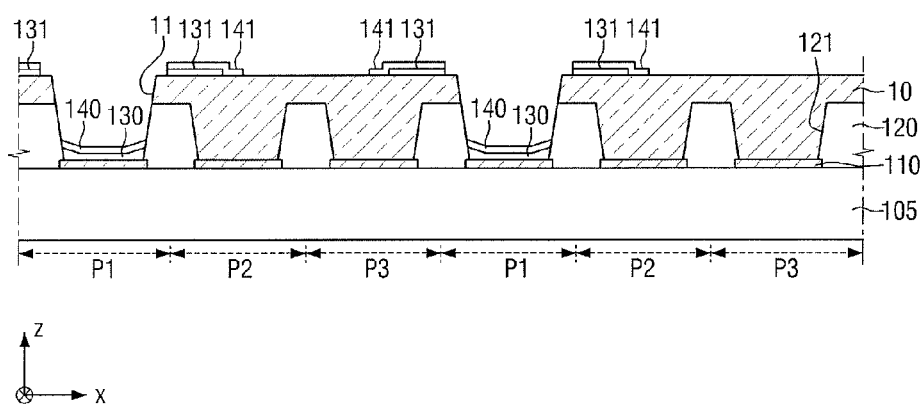

Referring to FIGS. 10 and 11, a hole transport layer 140 may be formed on the hole injection layer 130 of each of the first pixels P1 which is exposed through one of the first pattern openings 11 of the first photoresist pattern 10.

Specifically, referring to FIG. 10, the hole transport solution 140a may be ejected onto the hole injection layer 130 of each of the first pixels P1 using an ejector 30. If a minimum amount of the hole transport solution 140a ejected once into an opening 121 of the pixel defining layer 120 through each of the first pattern openings 11 of the first photoresist pattern 10 is greater than an amount of the hole transport solution 140a which fills the opening 121 of the pixel defining layer 120, some of the hole transport solution 140a may flow onto the first photoresist pattern 10 in a part of an adjacent pixel (e.g., a part of a second pixel P2).

When the hole transport layer 140 is formed by drying the hole transport solution 140a ejected onto the hole injection layer 130 of each of the first pixels P1, as illustrated in FIG. 11, some of the hole transport solution 140a which is located on the first photoresist pattern 10 on the part of the adjacent pixel (e.g., the part of the second pixel P2) may be dried, thereby forming a residual layer 141.

Figure 13:
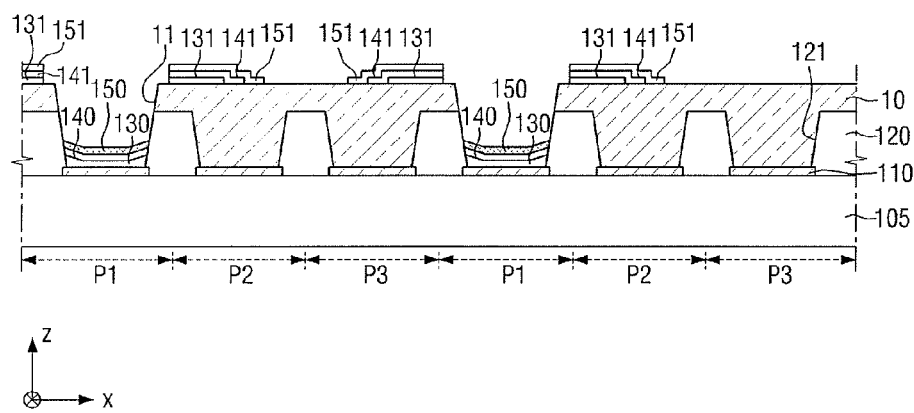

Referring to FIGS. 12 and 13, a light-emitting layer 150 may be formed on the hole transport layer 140 of each of the first pixels P1 which is exposed through one of the first pattern openings 11 of the first photoresist pattern 10. The light-emitting layer 150 may be a red light-emitting layer, for example.

Specifically, referring to FIG. 12, the light-emitting solution 150a may be ejected onto the hole transport layer 140 of each of the first pixels P1 using an ejector 40. If a minimum amount of the light-emitting solution 150a ejected once into an opening 121 of the pixel defining layer 120 through each of the first pattern openings 11 of the first photoresist pattern 10 is greater than an amount of the light-emitting solution 150a which fills the opening 121 of the pixel defining layer 120, some of the light-emitting solution 150a may flow onto the first photoresist pattern 10 in a part of an adjacent pixel (e.g., a part of a second pixel P2).

When the light-emitting layer 150 is formed by drying the light-emitting solution 150a ejected onto the hole transport layer 140 of each of the first pixels P1, as illustrated in FIG. 13 some of the light-emitting solution 150a which is located on the first photoresist pattern 10 on the part of the adjacent pixel (e.g., the part of the second pixel P2) may be dried, thereby forming a residual layer 151.

Figure 14:
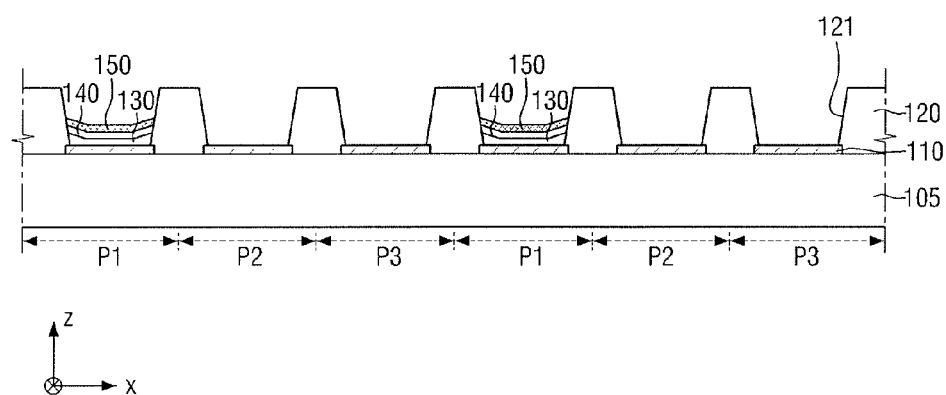

Referring to FIG. 14, the first photoresist pattern 10 and the residual layers 131, 141 and 151 may be removed. The removal of the first photoresist pattern 10 may be achieved by, for example, a lift-off process using a stripper which minimizes damage to the materials of the hole injection layer 130, the hole transport layer 140 and the light-emitting layer 150. When surfaces of the hole injection layer 130, the hole transport layer 140 and the light-emitting layer 150 are damaged by the lift-off process, a surface processing process may be performed.

A process of forming the hole injection layer 130, the hole transport layer 140 and the light-emitting layer 150 on the first electrode 110 of each of the second pixels P2 and a process of forming the hole injection layer 130, the hole transport layer 140 and the light-emitting layer 150 on the first electrode 110 of each of the third pixels P3 may be performed in the same way as the above process of forming the hole injection layer 130, the hole transport layer 140 and the light-emitting layer 150 on the first electrode 110 of each of the first pixels P1.

For example, a process of forming a second photoresist pattern having second pattern openings, each exposing the first electrode 110 of one of the second pixels P2, a process of forming the hole injection layer 130, the hole transport layer 140 and the light-emitting layer 150 on the first electrode 110, and a process of removing the second photoresist pattern may be performed. The light-emitting layer 150 of each of the second pixels P2 may be a green light-emitting layer, for example.

In addition, a process of forming a third photoresist pattern having third pattern openings, each exposing the first electrode 110 of one of the third pixels P3, a process of forming the hole injection layer 130, the hole transport layer 140 and the light-emitting layer 150 on the first electrode 110, and a process of removing the third photoresist pattern may be performed. The light-emitting layer 150 of each of the third pixels P3 may be a blue light-emitting layer, for example.

Figure 15:
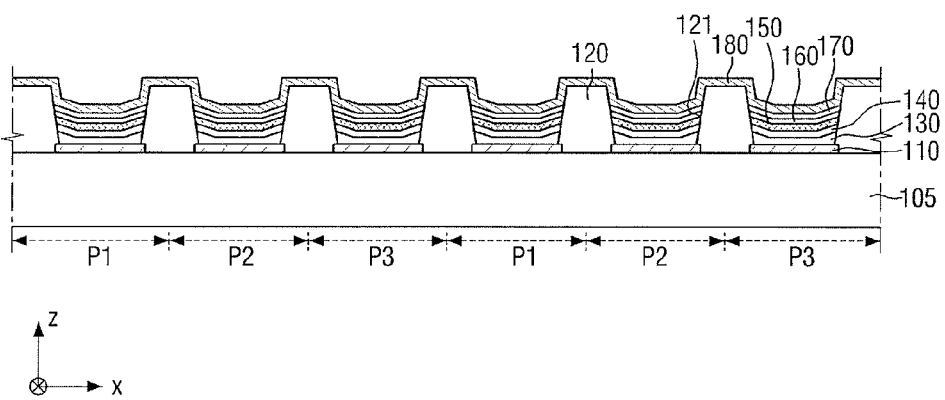

Referring to FIG. 15, an electron transport layer 160, an electron injection layer 170 and a second electrode 180 may be formed on the light-emitting layer 150. The electron transport layer 160, the electron injection layer 170, and the second electrode 180 may be formed successively using a deposition method, for example.

The method of manufacturing the light-emitting display device 100 according to the exemplary embodiment may further include placing an encapsulation substrate on the second electrode 180. In addition, the method of manufacturing the light-emitting display device 100 according to the exemplary embodiment may further include placing a spacer between the second electrode 180 and the encapsulation substrate. A suitable method of placing the encapsulation substrate and the spacer may be used.

As described above, in the method of manufacturing the light-emitting display device 100 according to the exemplary embodiment, the hole injection layer 130, the hole transport layer 140, and the light-emitting layer 150 may be formed on the first electrode 110 of each desired pixel using, for example, a printing method in a state where the first photoresist pattern 10 covers the first electrode 110 of each undesired pixel. Then, the first photoresist pattern 10 may be removed using a lift-off method. Therefore, this may prevent the overlapping of the light-emitting layers 150 which emit light of different colors in adjacent pixels.

Accordingly, unwanted mixed colors may be prevented from being displayed on the light-emitting display device 100 while the light-emitting display device 100 is being driven, and a high-resolution light-emitting display device may be realized.

A method of manufacturing the light-emitting display device 200 according to another exemplary embodiment will now be described.

FIGS. 16 through 26 are cross-sectional views illustrating a method of manufacturing the light-emitting display device 200 of FIG. 3.

A first electrode 110 may be formed on a substrate 105 having a plurality of pixels P (see FIG. 1). The first electrode 110 may be formed in each P1, P2 or P3 of the pixels P. A pixel defining layer 120, which defines each pixel P1, P2 or P3 and may have a plurality of openings 121, each exposing the first electrode 110, may be formed on the substrate 105. This has been described above in detail with reference to FIG. 5, and thus a redundant description thereof is omitted.

A first photoresist pattern 10 having first pattern openings 11, each exposing the first electrode 110 of each first pixel P1, may be formed on the pixel defining layer 120. This has been described above in detail with reference to FIGS. 6 and 7, and thus a redundant description thereof is omitted.

Figure 16:
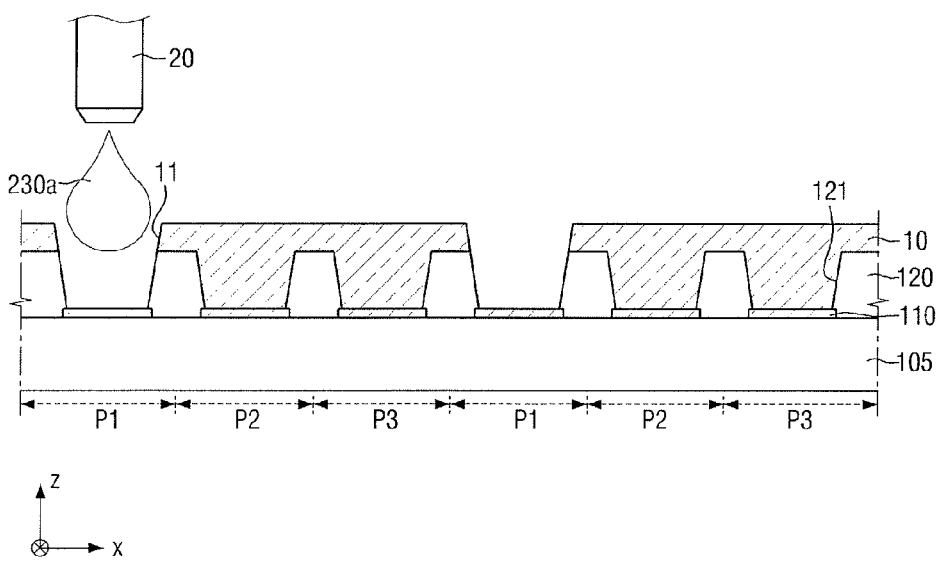
FIGS. 16 through 26 illustrate cross-sectional views illustrating a method of manufacturing the light-emitting display device of FIG. 3.
Figure 17:
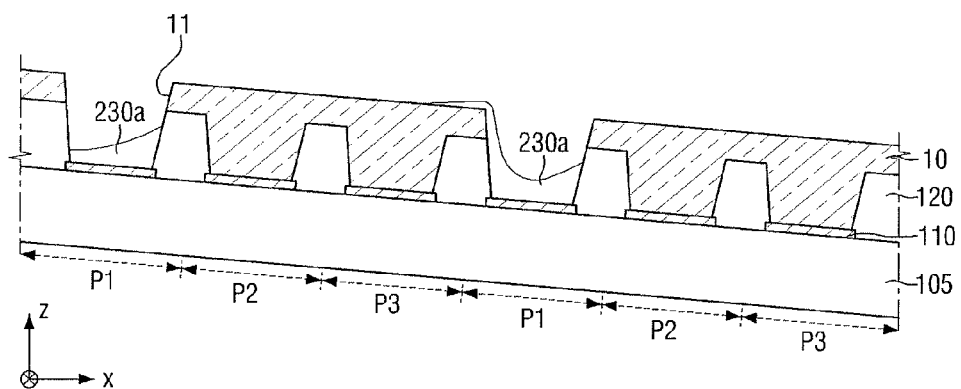
Figure 18:
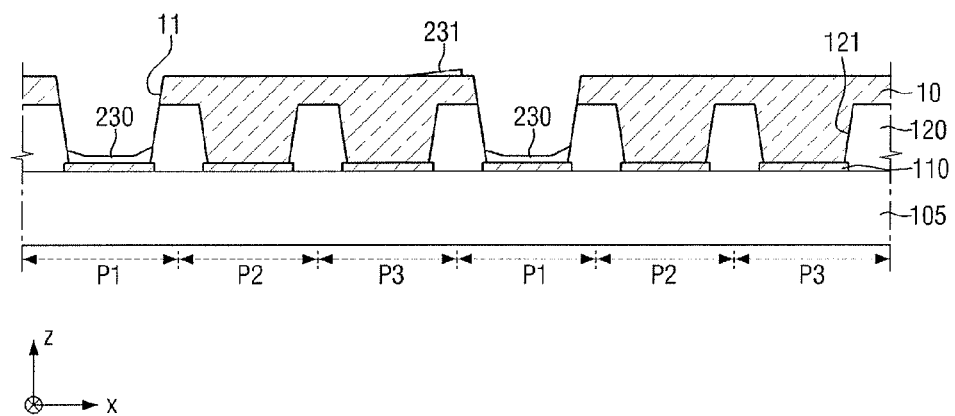

Referring to FIGS. 16 through 18, a hole injection layer 230 may be formed on the first electrode 110 of each of the first pixels P1 which is exposed through one of the first pattern openings 11 of the first photoresist pattern 10.

Specifically, referring to FIG. 16, a hole injection solution 230a may be ejected using an ejector 20 onto the first electrodes 110 of some of the first pixels P1 which are exposed through the first pattern openings 11 of the first photoresist pattern 10. In an example, the hole injection solution 230a may be ejected onto the first electrodes 110 of one pixel column of the first pixels P1, e.g., a first pixel column PG1 in FIG. 1. In another example, the hole injection solution 230a may be ejected onto the first electrodes 110 of a plurality of pixel columns of the first pixels P1 in FIG. 1. Here, at least one pixel column onto which the hole injection solution 230a is not ejected may exist between the pixel columns. For example, the hole injection solution 230a may be ejected onto the first electrodes 110 of the first pixel column PG1 and a third pixel column PG3 of the first pixels P1 in FIG. 1, and a second pixel column PG2 onto which the hole injection solution 230a is not ejected may exist between the first pixel column PG1 and the third pixel column PG3.

In this case, a minimum amount of the hole injection solution 230a ejected once into an opening 121 of the pixel defining layer 120 through each of the first pattern openings 11 of the first photoresist pattern 10 may be greater than an amount of the hole injection solution 230a which fills the opening 121 of the pixel defining layer 120. In addition, when the hole injection solution 230a is ejected, first and second sides of the substrate 105 may be at a same height.

Referring to FIG. 17, the substrate 105 may be tilted such that the hole injection solution 230a is coated on the first electrodes 110 of the other ones of the first pixels P1 onto which the hole injection solution 230a is not ejected.

The tilting of the substrate 105 may be achieved by positioning a first side of the substrate 105 higher than a second side of the substrate 105, and the tilting angle of the substrate 105 may be less than about 50 degrees. When the substrate 105 is tilted, some of the hole injection solution 230a ejected onto the first electrodes 110 of some of the first pixels P1 flows from the first side of the substrate 105 toward the second side of the substrate 105 to fill the openings 121 of the pixel defining layer 120 which expose the first electrodes 110 of the other ones of the first pixels P1 onto which the hole injection solution 230a is not ejected. Accordingly, the use efficiency of the hole injection solution 230a may be improved when the minimum amount of the hole injection solution 230a ejected once is greater than the amount of the hole injection solution 230a which fills an opening 121 of the pixel defining layer 120.

To make some of the hole injection solution 230a ejected onto the first electrodes 110 of some of the first pixels P1 flow from the first side of the substrate 105 toward the second side of the substrate 105 more efficiently when the substrate 105 is tilted, air of an air knife may be applied to the hole injection solution 230a, thereby increasing the flowing efficiency of the hole injection solution 230a.

The tilting of the substrate 105 may cause the hole injection solution 230a (see FIG. 17) located on the first electrodes 110 of the first pixels P1 to contact first and second sides of the pixel defining layer 120 at different heights within the openings 121 of the pixel defining layer 120.

In addition, when some of the hole injection solution 230a ejected onto the first electrodes 110 of some of the first pixels P1 flows from the first side of the substrate 105 toward the second side of the substrate 105, part of the hole injection solution 230a may be located on a part of the first photoresist pattern 10 which is adjacent to each first pixel P1 having a corresponding opening 121 of the pixel defining layer 120 filled with the hole injection solution 230a.

Referring to FIG. 18, the substrate 105 is tilted such that the first and second sides of the substrate 105 may be at the same height, and then the hole injection solution 230a is dried.

When the substrate 105 is tilted such that the first and second sides of the substrate 105 are at the same height, some of the hole injection solution 230a (see FIG. 17) located on the first photoresist pattern 10 may flow into an opening 121 of the pixel defining layer 120 in each adjacent first pixel P1. Accordingly, a difference between a height at which the hole injection solution 230a (see FIG. 17) contacts the first side of the pixel defining layer 120 in the opening 121 of the pixel defining layer 120 and a height at which the hole injection solution 230a contacts the second side of the pixel defining layer 120 in the opening 121 of the pixel defining layer 12 may be somewhat reduced.

If the hole injection solution 230a located at different heights on the first and second sides of the pixel defining layer 120 is dried, the hole injection layer 230 may be formed to different heights on the first and second sides of the pixel defining layer 120 within the openings 121 of the pixel defining layer 120. Here, some of the hole injection solution 230a which is located on the first photoresist pattern 10 may be dried, thereby forming a residual layer 231.

Figure 19:
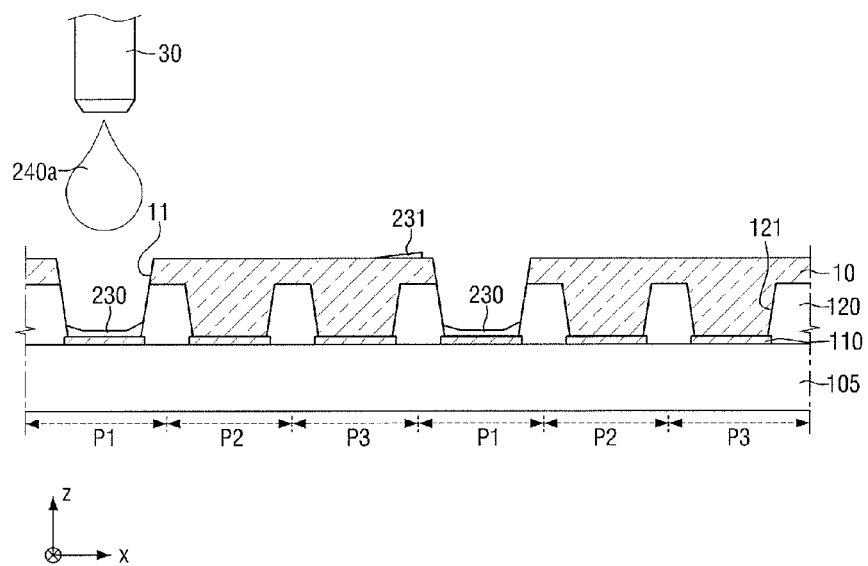
Figure 20:
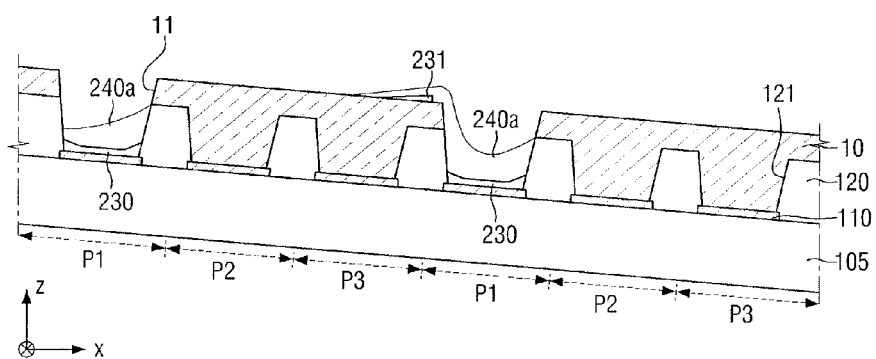
Figure 21:
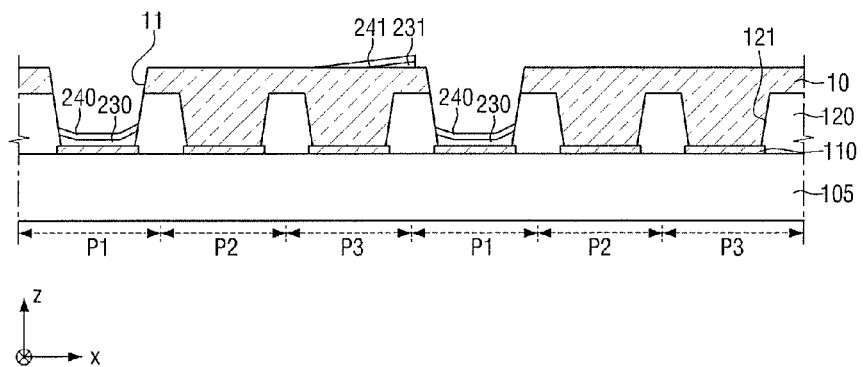

Referring to FIGS. 19 through 21, a hole transport layer 240 may be formed on the hole injection layer 230 of each of the first pixels P1 which is exposed through one of the first pattern openings 11 of the first photoresist pattern 10.

Specifically, referring to FIG. 19, a hole transport solution 240a may be ejected onto the hole injection layers 230 of some of the first pixels P1 using an ejector 30. In an example, the hole transport solution 240a may be ejected onto the hole injection layers 230 of the first pixel column PG1 of the first pixels P1 in FIG. 1. In another example, the hole transport solution 240a may be ejected onto the hole injection layers 230 of a plurality of pixel columns of the first pixels P1 in FIG. 1. Here, at least one pixel column onto which the hole transport solution 240a is not ejected may exist between the pixel columns (PG1 and PG3). For example, the hole transport solution 240a may be ejected onto the hole injection layers 230 of the first pixel column PG1 and the third pixel column PG3 of the first pixels P1 in FIG. 1, and the second pixel column PG2 onto which the hole transport solution 240a is not ejected may exist between the first pixel column PG1 and the third pixel column PG3.

In this case, a minimum amount of the hole transport solution 240a ejected once into an opening 121 of the pixel defining layer 120 through each of the first pattern openings 11 of the first photoresist pattern 10 may be greater than an amount of the hole transport solution 240a which fills the opening 121 of the pixel defining layer 120. In addition, when the hole transport solution 240a is ejected, the first and second sides of the substrate 105 may be at the same height.

Referring to FIG. 20, the substrate 105 may be tilted such that the hole transport solution 240a is coated on the hole injection layers 230 of the other ones of the first pixels P1 onto which the hole transport solution 240a is not ejected.

The tilting of the substrate 105 may be achieved by positioning the first side of the substrate 105 higher than the second side of the substrate 105, and the tilting angle of the substrate 105 may be less than about 50 degrees. When the substrate 105 is tilted, some of the hole transport solution 240a ejected onto the hole injection layers 230 of some of the first pixels P1 flows from the first side of the substrate 105 toward the second side of the substrate 105 to fill the openings 121 of the pixel defining layer 120 which expose the hole injection layers 230 of the other ones of the first pixels P1 onto which the hole transport solution 240a is not ejected. Accordingly, the use efficiency of the hole transport solution 240a may be improved when the minimum amount of the hole transport solution 240a ejected once is greater than the amount of the hole transport solution 240a which fills an opening 121 of the pixel defining layer 120.

To make some of the hole transport solution 240a ejected onto the hole injection layers 230 of some of the first pixels P1 which are exposed through the first pattern openings 11 of the first photoresist pattern 10 flow from the first side of the substrate 105 toward the second side of the substrate 105 more efficiently when the substrate 105 is tilted, the air of the air knife may be applied to the hole transport solution 240a, thereby increasing the flowing efficiency of the hole transport solution 240a.

The tilting of the substrate 105 may cause the hole transport solution 240a (see FIG. 20) located on the hole injection layers 230 of the first pixels P1 to contact the first and second sides of the pixel defining layer 120 at different heights within the openings 121 of the pixel defining layer 120.

In addition, when some of the hole transport solution 240a ejected onto the hole injection layers 230 of some of the first pixels P1 flows from the first side of the substrate 105 toward the second side of the substrate 105, part of the hole transport solution 240a may be located on a part of the first photoresist pattern 10 which is adjacent to each first pixel P1 having a corresponding opening 121 of the pixel defining layer 120 filled with the hole transport solution 240a.

Referring to FIG. 21, the substrate 105 is tilted such that the first and second sides of the substrate 105 may be at the same height, and then the hole transport solution 240a is dried.

When the substrate 105 is tilted such that the first and second sides of the substrate 105 are at the same height, some of the hole transport solution 240a (see FIG. 20) located on the first photoresist pattern 10 may flow into an opening 121 of the pixel defining layer 120 in each adjacent first pixel P1. Accordingly, a difference between a height at which the hole transport solution 240a (see FIG. 20) contacts the first side of the pixel defining layer 120 in the opening 121 of the pixel defining layer 120 and a height at which the hole transport solution 240a contacts the second side of the pixel defining layer 120 in the opening 121 of the pixel defining layer 12 may be somewhat reduced.

If the hole transport solution 240a located at different heights on the first and second sides of the pixel defining layer 120 is dried, the hole transport layer 240 may be formed to different heights on the first and second sides of the pixel defining layer 120 within the openings 121 of the pixel defining layer 120. Here, some of the hole transport solution 240a which is located on the first photoresist pattern 10 may be dried, thereby forming a residual layer 241.

Figure 22:
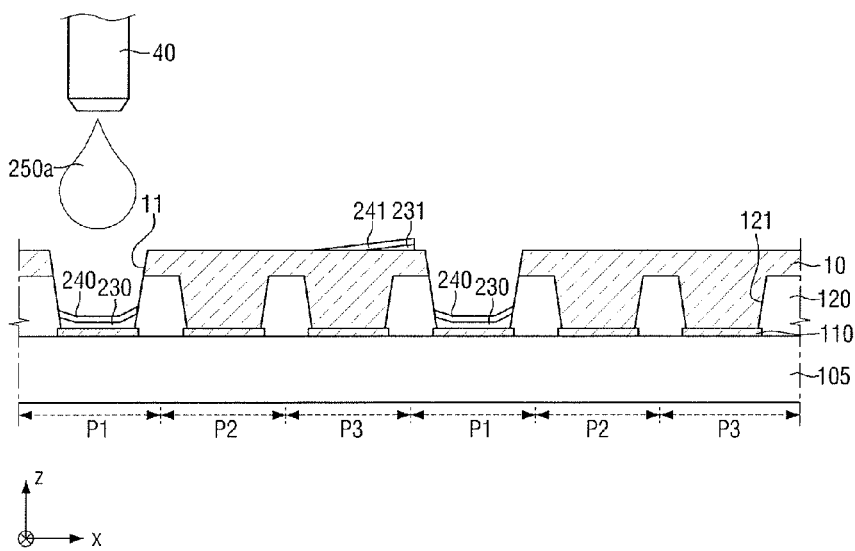
Figure 23:
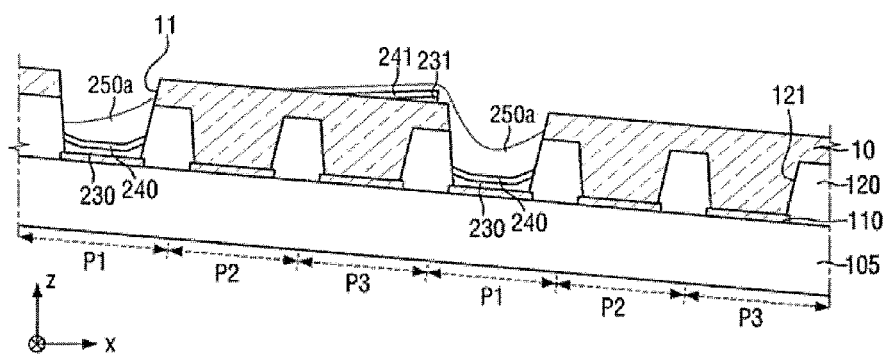
Figure 24:
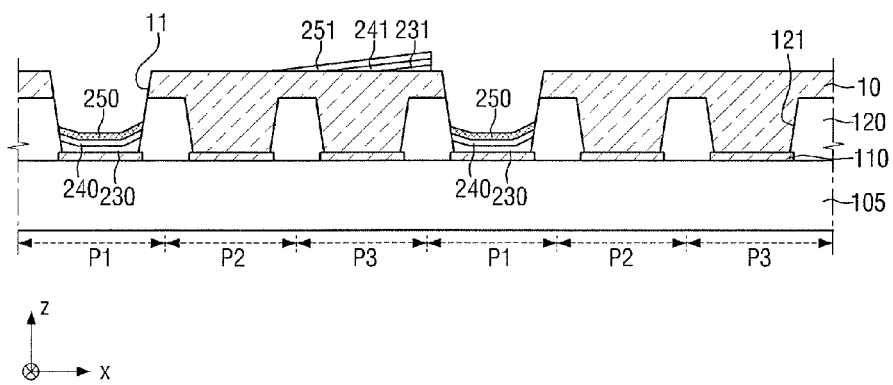

Referring to FIGS. 22 through 24, a light-emitting layer 250 may be formed on the hole transport layer 240 of each of the first pixels P1 which is exposed through one of the first pattern openings 11 of the first photoresist pattern 10.

Specifically, referring to FIG. 22, a light-emitting solution 250a may be ejected onto the hole transport layers 240 of some of the first pixels P1 using an ejector 40. In an example, the light-emitting solution 250a may be ejected onto the hole transport layers 240 of the first pixel column PG1 of the first pixels P1 in FIG. 1. In another example, the light-emitting solution 250a may be ejected onto the hole transport layers 240 of a plurality of pixel columns of the first pixels P1 in FIG. 1. Here, at least one pixel column onto which the light-emitting solution 250a is not ejected may exist between the pixel columns (PG1 and PG3). For example, the light-emitting solution 250a may be ejected onto the hole transport layers 240 of the first pixel column PG1 and the third pixel column PG3 of the first pixels P1 in FIG. 1, and the second pixel column PG2 onto which the light-emitting solution 250a is not ejected may exist between the first pixel column PG1 and the third pixel column PG3.

In this case, a minimum amount of the light-emitting solution 250a ejected once into an opening 121 of the pixel defining layer 120 through each of the first pattern openings 11 of the first photoresist pattern 10 may be greater than an amount of the light-emitting solution 250a which fills the opening 121 of the pixel defining layer 120. In addition, when the light-emitting solution 250a is ejected, the first and second sides of the substrate 105 may be at the same height.

Referring to FIG. 23, the substrate 105 may be tilted such that the light-emitting solution 250a may be coated on the hole transport layers 240 of the other ones of the first pixels P1 onto which the light-emitting solution 250a is not ejected.

The tilting of the substrate 105 may be achieved by positioning the first side of the substrate 105 higher than the second side of the substrate 105, and the tilting angle of the substrate 105 may be less than about 50 degrees. When the substrate 105 is tilted, some of the light-emitting solution 250a ejected onto the hole transport layers 240 of some of the first pixels P1 which are exposed through the first pattern openings 11 of the first photoresist pattern 10 flows from the first side of the substrate 105 toward the second side of the substrate 105 to fill the openings 121 of the pixel defining layer 120 which expose the hole transport layers 240 of the other ones of the first pixels P1 onto which the light-emitting solution 250a is not ejected. Accordingly, the use efficiency of the light-emitting solution 250a may be improved when the minimum amount of the light-emitting solution 250a ejected once is greater than the amount of the light-emitting solution 250a which fills an opening 121 of the pixel defining layer 120.

To make some of the light-emitting solution 250a ejected onto the hole transport layers 240 of some of the first pixels P1 flow from the first side of the substrate 105 toward the second side of the substrate 105 more efficiently when the substrate 105 is tilted, the air of the air knife may be applied to the light-emitting solution 250a, thereby increasing the flowing efficiency of the light-emitting solution 250a.

The tilting of the substrate 105 may cause the light-emitting solution 250a (see FIG. 23) located on the hole transport layers 240 of the first pixels P1 to contact the first and second sides of the pixel defining layer 120 at different heights within the openings 121 of the pixel defining layer 120.

In addition, when some of the light-emitting solution 250a ejected onto the hole transport layers 240 of some of the first pixels P1 which are exposed through the first pattern openings 11 of the first photoresist pattern 10 flows from the first side of the substrate 105 toward the second side of the substrate 105, part of the light-emitting solution 250a may be located on a part of the first photoresist pattern 10 which is adjacent to each first pixel P1 having a corresponding opening 121 of the pixel defining layer 120 filled with the light-emitting solution 250a.

Referring to FIG. 24, the substrate 105 is tilted such that the first and second sides of the substrate 105 may be at the same height, and then the light-emitting solution 250a is dried.

When the substrate 105 is tilted such that the first and second sides of the substrate 105 are at the same height, some of the light-emitting solution 250a (see FIG. 23) located on the first photoresist pattern 10 may flow into an opening 121 of the pixel defining layer 120 in each adjacent first pixel P1. Accordingly, a difference between a height at which the light-emitting solution 250a (see FIG. 23) contacts the first side of the pixel defining layer 120 in the opening 121 of the pixel defining layer 120 and a height at which the light-emitting solution 250a contacts the second side of the pixel defining layer 120 in the opening 121 of the pixel defining layer 12 may be somewhat reduced.

If the light-emitting solution 250a located at different heights on the first and second sides of the pixel defining layer 120 is dried, the light-emitting layer 250 may be formed to different heights on the first and second sides of the pixel defining layer 120 within the openings 121 of the pixel defining layer 120. Here, some of the light-emitting solution 250a which is located on the first photoresist pattern 10 may be dried, thereby forming a residual layer 251.

Figure 25:
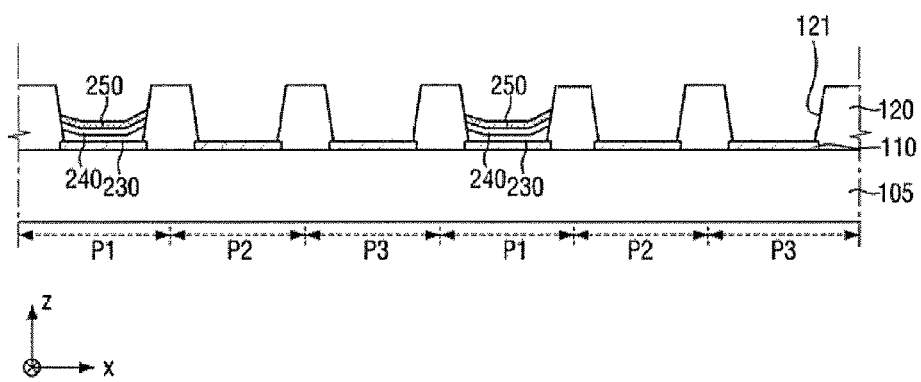

Referring to FIG. 25, the first photoresist pattern 10 is removed together with the residual layers 231, 241, and 251. The removal of the first photoresist pattern 10 may be achieved by, for example, a lift-off process using a stripper which minimizes the damage to the materials of the hole injection layer 230, the hole transport layer 240 and the light-emitting layer 250. When surfaces of the hole injection layer 230, the hole transport layer 240 and the light-emitting layer 250 are damaged by the lift-off process, a surface processing process may be performed.

A process of forming the hole injection layer 230, the hole transport layer 240 and the light-emitting layer 250 on the first electrode 110 of each second pixel P2 and a process of forming the hole injection layer 230, the hole transport layer 240 and the light-emitting layer 250 on the first electrode 110 of each third pixel P3 may be performed in the same way as the above process of forming the hole injection layer 230, the hole transport layer 240 and the light-emitting layer 250 on the first electrode 110 of each first pixel P1.

For example, a process of forming a second photoresist pattern having second pattern openings, each exposing the first electrode 110 of one of the second pixels P2, a process of forming the hole injection layer 230, the hole transport layer 240 and the light-emitting layer 250 on the first electrode 110 by tilting the substrate 105, and a process of removing the second photoresist pattern may be performed. The light-emitting layer 250 of each of the second pixels P2 may be a green light-emitting layer, for example.

In addition, a process of forming a third photoresist pattern having third pattern openings, each exposing the first electrode 110 of one of the third pixels P3, a process of forming the hole injection layer 230, the hole transport layer 240 and the light-emitting layer 250 on the first electrode 110 by tilting the substrate 105, and a process of removing the third photoresist pattern may be performed. The light-emitting layer 150 of each of the third pixels P3 may be a blue light-emitting layer, for example.

Figure 26:
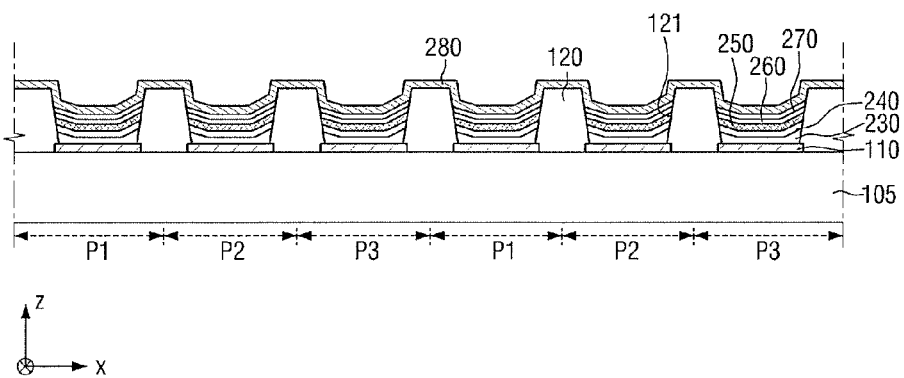

Referring to FIG. 26, an electron transport layer 260, an electron injection layer 270 and a second electrode 280 may be formed on the light-emitting layer 250. The electron transport layer 260, the electron injection layer 270, and the second electrode 280 may be formed successively using a deposition method, for example.

The method of manufacturing the light-emitting display device 200 according to the exemplary embodiment may further include placing an encapsulation substrate on the second electrode 280. In addition, the method of manufacturing the light-emitting display device 200 according to the exemplary embodiment may further include placing a spacer between the second electrode 280 and the encapsulation substrate. Various methods of placing the encapsulation substrate and the spacer are widely known to those of ordinary skill in the art, and thus a detailed description thereof is omitted.

As described above, in the method of manufacturing the light-emitting display device 200 according to the exemplary embodiment, the hole injection layer 230, the hole transport layer 240 and the light-emitting layer 250 may be formed on the first electrode 110 of each desired pixel using, for example, a printing method in a state where the first photoresist pattern 10 covers the first electrode 110 of each undesired pixel. Then, the first photoresist pattern 10 may be removed using a lift-off method, for example. Therefore, this may prevent the overlapping of the light-emitting layers 250 which emit light of different colors in adjacent pixels.

Accordingly, unwanted mixed colors may be prevented from being displayed on the light-emitting display device 200 while the light-emitting display device 200 is being driven, and a high-resolution light-emitting display device may be realized.

In addition, in the method of manufacturing the light-emitting display device 200 according to the exemplary embodiment, when the hole injection layer 230, the hole transport layer 240 and the light-emitting layer 250 are formed on the first electrode 110 of each desired pixel using a printing method in a state where the first photoresist pattern 10 covers the first electrode 110 of each undesired pixel, the substrate 105 is tilted in a printing process to cause a solution to spread to pixels which emit light of the same color. This may improve the use efficiency of the solution.

By way of summation and review, in a method of manufacturing a light-emitting display device according to exemplary embodiments, a light-emitting display device having improved display quality and high resolution may be manufactured.

The organic light-emitting display device may include a pixel defining layer formed on a substrate having a plurality of pixels arranged in a matrix. The pixel defining layer may have an opening that exposes the anode formed in each of the pixels. The hole injection layer, the hole transport layer, the organic light-emitting layer, the electron transport layer, the electron injection layer, and the cathode may be formed on the anode exposed through the opening of the pixel defining layer. For example, each of the hole injection layer, the hole transport layer and the light-emitting layer may be formed as a thin pattern layer by ejecting a solution into the opening of the pixel defining layer using a simple solution coating method such as an inkjet printing method or a nozzle printing method and drying the ejected solution.

However, when each of the hole injection layer, the hole transport layer and the light-emitting layer is formed by ejecting a solution into the opening of the pixel defining layer using an inkjet printing method or a nozzle printing method and drying the ejected solution, the solution ejected into the opening of the pixel defining layer may flow toward an adjacent pixel. Accordingly, each of the hole injection layer, the hole transport layer and the light-emitting layer may be unwantedly formed in a part of the adjacent pixel. In this case, light-emitting layers which emit light of different colors in adjacent pixels may be formed to overlap each other. As a result, unwanted mixed colors may be displayed on the light-emitting display device, thereby deteriorating the display quality of the light-emitting display device.

In addition, when a light-emitting display device having a small pixel size is manufactured, since the amount of a solution that may fill an opening of a pixel defining layer is smaller than the minimum amount of the solution ejected, light-emitting layers which emit light of different colors in adjacent pixels may be formed to overlap each other more. This may make it difficult to realize a high-resolution light-emitting display device.

Exemplary embodiments may provide a method of manufacturing a light-emitting display device having improved display quality and high resolution.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a light-emitting display device, the method comprising:
   forming a first electrode on a substrate, the substrate having a plurality of first pixel areas and a plurality of second pixel areas, the first electrode being formed in each of the first and second pixel areas such that corresponding first and second pixels are formed;
   forming a pixel defining layer on the substrate, the pixel defining layer having an opening exposing the first electrode of each of the first and second pixels;
   forming a first photoresist pattern on the pixel defining layer, the first photoresist pattern having a first pattern opening exposing the first electrode of each of the first pixels;
   forming a light-emitting layer on the first electrode exposed through the first pattern opening; and
   removing the first photoresist pattern,
   wherein forming the light-emitting layer includes ejecting a light-emitting solution onto the first electrode of some of the first pixels and tilting the substrate to cause the light-emitting solution to flow onto the first electrode of other ones of the first pixels, and the first photoresist pattern covers the second pixels during the forming of the light emitting layer on the first electrode exposed through the first pattern opening.

2. The method as claimed in claim 1, wherein the removing of the first photoresist pattern is performed using a lift-off process.

3. The method as claimed in claim 1, wherein the first photoresist pattern comprises fluorine resin.

4. The method as claimed in claim 1, wherein the light-emitting layer is formed using a printing method.

5. The method as claimed in claim 1, wherein the first and second pixels emit light of different colors, and the first photoresist pattern covers the second pixels during the forming of the light emitting layer on the first electrode exposed through the first pattern opening.

6. The method as claimed in claim 1, further comprising, between the forming of the first photoresist pattern and the forming of the light-emitting layer, forming at least one of a hole injection layer and a hole transport layer on the first electrode exposed through the first pattern opening.

7. The method as claimed in claim 6, wherein either of the hole injection layer and the hole transport layer is formed using a printing method.

8. The method as claimed in claim 1, further comprising, after the removing of the first photoresist pattern,
   forming a second photoresist pattern on the pixel defining layer, the second photoresist pattern having a second pattern opening exposing the first electrode of each of the second pixels;
   forming a second light-emitting layer on the first electrode exposed through the second pattern opening, the second light-emitting layer emitting light of a different color from the light-emitting layer of each of the first pixels; and
   removing the second photoresist pattern.

9. The method as claimed in claim 1, wherein the first pixels form a plurality of pixel columns along a second direction intersecting a first direction, and the second pixels form a plurality of pixel columns along the second direction, and
   wherein the pixel columns of the first pixels and the pixel columns of the second pixels are located alternately along the first direction and the some of the first pixels form one of the pixel columns of the first pixels.

10. The method as claimed in claim 1, wherein the first pixels form a plurality of pixel columns along a second direction intersecting a first direction, and the second pixels form a plurality of pixel columns along the second direction, and
    wherein the pixel columns of the first pixels and the pixel columns of the second pixels are located alternately along the first direction, and the some of the first pixels form a plurality of pixel columns and at least one pixel column formed by the other ones of the first pixels onto which the light-emitting solution is not ejected is interposed therebetween.

11. The method as claimed in claim 1, wherein when the light-emitting solution is ejected, first and second sides of the substrate are at a same height, and
    wherein the tilting of the substrate is achieved by placing the first and second sides of the substrate at different heights.

12. The method as claimed in claim 1, wherein the forming of the light-emitting layer further includes applying air of an air knife to the light-emitting solution.

13. The method as claimed in claim 1, wherein, after the light-emitting solution is coated on the first electrodes of the other ones of the first pixels, the forming of the light-emitting layer further includes tilting the substrate such that the first and second sides of the substrate are at a same height and drying the light-emitting solution.

* * * * *